(12) United States Patent
Yoo et al.

(10) Patent No.: US 7,696,561 B2
(45) Date of Patent: Apr. 13, 2010

(54) NON-VOLATILE MEMORY DEVICE, METHOD OF MANUFACTURING THE SAME AND METHOD OF OPERATING THE SAME

(75) Inventors: Hyun-Khe Yoo, Gyeonggi-do (KR); Jeong-Uk Han, Suwon-si (KR); Hee-Seog Jeon, Suwon-si (KR); Sung-Gon Choi, Osani-si (KR); Bo-Young Seo, Anyang-si (KR); Chang-Min Jeon, Seoul (KR); Ji-Do Ryu, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 355 days.

(21) Appl. No.: 11/870,762

(22) Filed: Oct. 11, 2007

(65) Prior Publication Data
US 2008/0089136 A1 Apr. 17, 2008

(30) Foreign Application Priority Data
Oct. 13, 2006 (KR) .................... 10-2006-0099600

(51) Int. Cl.
*H01L 21/336* (2006.01)
(52) U.S. Cl. .............................. 257/321; 257/E21.422; 257/E21.69; 438/258

(58) Field of Classification Search ................. 257/321, 257/E21.422, E21.69; 438/258
See application file for complete search history.

(56) References Cited

U.S. PATENT DOCUMENTS

| 5,867,425 A * | 2/1999 | Wong .................... 365/185.08 |
| 6,326,265 B1 * | 12/2001 | Liu et al. .................... 438/257 |
| 2006/0285374 A1 * | 12/2006 | Szeto et al. .................... 365/49 |

FOREIGN PATENT DOCUMENTS

| JP | 2003-051559 | 2/2003 |
| KR | 1998-39572 | 8/1998 |
| KR | 1020040079057 A | 9/2004 |

* cited by examiner

*Primary Examiner*—Trung Dang
(74) *Attorney, Agent, or Firm*—F. Chau & Associates, LLC

(57) ABSTRACT

A non-volatile memory device includes a first sensing line, a first word line, a depletion channel region, and impurity regions. The first sensing line and the first word line are formed adjacent to each other in parallel on a substrate. The first sensing line and the first word line have a tunnel oxide layer, a first conductive pattern, a dielectric layer pattern and a second conductive pattern sequentially stacked on the substrate. The depletion channel region is formed at an upper portion of the substrate under the first sensing line. The impurity regions are formed at upper portions of the substrate exposed by the first sensing line and the first word line.

18 Claims, 6 Drawing Sheets

NON-VOLATILE MEMORY DEVICE, METHOD OF MANUFACTURING THE SAME AND METHOD OF OPERATING THE SAME

CROSS-REFERENCE TO RELATED APPLICATION

This application claims priority under 35 U.S.C, §119 to Korean Patent Application No. 2006-99600, filed on Oct. 13, 2006 in the Korean Intellectual Property Office (KIPO), the contents of which are incorporated herein by reference in their entirety.

BACKGROUND OF THE INVENTION

1. Technical Field

Exemplary embodiments of the present invention relate to a non-volatile memory device, a method of manufacturing the non-volatile memory device, and a method of operating the non-volatile memory device. More particularly, exemplary embodiments of the present invention relate to a non-volatile memory device including a memory transistor and a select transistor in a unit cell, a method of manufacturing the non-volatile memory device and a method of operating the non-volatile memory device.

2. Discussion of Related Art

Electrically erasable programmable read-only memory (EEPROM) devices, which are a type of non-volatile memory device, are used in various fields because the EEPROM devices can electrically store and erase data and preserve data without being provided with power.

In an EEPROM device, electrons pass through a thin insulation layer, that is, a tunnel oxide layer, such as a silicon oxide layer, using Fowler-Nordheim (F-N) tunneling, so that electric charges may be stored in a floating gate in the EEPROM device. The on or off state of a transistor in the EEPROM device depends on the amount of the stored electric charges. A floating gate tunnel oxide (FLOTOX) type device, which is a type of EEPROM device, has a unit cell including a select transistor for selecting a cell and a memory transistor for storing data.

The sizes of unit cells in the EEPROM device are required to be reduced as the memory capacity of the EEPROM device increases. The properties of the unit cells, however, may become poor as the sizes of the unit cells in the EEPROM device are reduced.

When the sizes of the unit cells of the EEPROM device are reduced, the channel length of a memory transistor included in the EEPROM device may also be reduced. The memory transistor may have a threshold voltage that is poorly distributed in on-state and off-state operations as the channel length is reduced.

Depletion layers between a drain region and a source region of the memory transistor make contact with each other as a result of the reduction of the channel length, thereby forming a parasitic depletion capacitor under a tunnel oxide layer. As a result, a voltage drop may occur during the programming or erasing of data. When the memory transistor has the poorly distributed threshold voltage, a programming/erasing window margin may be decreased, so that accurately distinguishing data stored in a unit cell may be difficult.

Additionally, electrons may be trapped in the tunnel oxide layer of the memory transistor when data is repeatedly programmed or erased in the unit cell of the EEPROM device. When the electrons are trapped, the threshold voltage of the memory transistor is increased in an on-state, so that an on-current may be decreased. When the on-current is decreased, the decreased on-current may not be detected by a sense amplifier in a reading operation, so that the memory transistor may not accurately distinguish data.

SUMMARY OF THE INVENTION

Exemplary embodiments of the present invention provide a non-volatile memory device having good threshold voltage distribution and high durability.

Exemplary embodiments of the present invention provide a method of manufacturing a non-volatile memory device having good threshold voltage distribution and high durability.

Exemplary embodiments of the present invention provide a method of operating a non-volatile memory device having good threshold voltage distribution and high durability.

According to an exemplary embodiment of the present invention, a non-volatile memory device includes a first sensing line, a first word line, a depletion channel region and impurity regions. The first sensing line and the first word line are formed adjacent to each other in parallel on a substrate. The first sensing line and the first word line have a tunnel oxide layer a first conductive pattern, a dielectric layer pattern, and a second conductive pattern sequentially stacked on the substrate. The depletion channel region is formed at an upper portion of the substrate under the first sensing line. The impurity regions are formed at upper portions of the substrate exposed by the first sensing line and the first word line.

In an exemplary embodiment of the present invention, a well doped with first conductive type impurities may be formed at a portion of the substrate for a cell of a memory device. A pocket well doped with second conductive type impurities may be formed in the well. The second conductive type may be different from the first conductive type.

In an exemplary embodiment of the present invention, the non-volatile memory device may further include spacers formed at both sides of the first sensing line and the first word line.

In an exemplary embodiment of the present invention, the spacers may cover portions of the substrate adjacent to both the first sensing line and the first word line.

According to an exemplary embodiment of the present invention, the non-volatile memory device may further include a highly doped region in a portion of the impurity region not adjacent to both the first sensing line and the first word line. The highly doped region may be configured to be doped more highly than other portions of the impurity region.

According to an exemplary embodiment of the present invention, the first sensing line and the first word line may be included in a first unit cell and may further include a second unit cell having a second sensing line and a second word line. The first unit cell and the second unit cell may be symmetrically disposed with respect to a boundary of the cells.

In an exemplary embodiment of the present invention, a distance between the first word line and the second word line may be wider than that between the first sensing line and the first word line.

In an exemplary embodiment of the present invention, the non-volatile memory device may further include an insulating interlayer covering the first sensing line and the first word line, a plug formed through the insulating interlayer and making contact with a portion of the impurity region adjacent to only to a sidewall of the first word line, the portion not being adjacent to a sidewall of the first sensing line, and a wiring electrically connected to the plug on the insulating interlayer.

According to an exemplary embodiment of the present invention, in a method of manufacturing a non-volatile memory device, a depletion channel region is formed by implanting first conductive type impurities into an upper portion of a substrate. A layer structure, in which a tunnel oxide layer, a first conductive layer, a dielectric layer and a second conductive layer are sequentially stacked, is formed on the substrate. The layer structure is patterned to form a first sensing line on the depletion channel region and a first word line is formed on a portion of the substrate adjacent to the depletion channel region. Impurity regions are formed by implanting the first conductive type impurities into portions of the substrate exposed by the first sensing line and the first word line.

In an exemplary embodiment of the present invention, prior to forming the depletion channel region: the method may further include forming a deep well by implanting the first conductive type impurities into a portion of the substrate for a cell of a memory device and forming a pocket well in the well by implanting second conductive type impurities into the deep well. The second conductive type may be different from the first conductive type.

In an exemplary embodiment of the present invention the method may further include forming spacers at both sides of the first sensing line and the first word line.

According to an exemplary embodiment of the present invention, the spacers may be formed to have a thickness to sufficiently cover portions of the substrate exposed by the first sensing line and the first word line.

According to an exemplary embodiment of the present invention, the method may further include forming a highly doped region in the impurity region by partially implanting the first conductive type impurities into a portion of the impurity region. The portion may be configured not to be adjacent to both the first sensing line and the first word line.

According to an exemplary embodiment of the present invention, the first sensing line may have a different width from that of the first word line. The first sensing line and the first word line may be included in a first unit cell and may further include a second unit cell having a second sensing line and a second word line. Further the non-volatile memory device may include a plurality of the sensing lines and the word lines. The first unit cell and the second unit cell next to the first unit cell may be formed to be symmetrically disposed with respect to a boundary between the first and the second unit cells.

In an exemplary embodiment of the present invention, a distance between the first word line and the second word line may be wider than a distance between the first sensing line and the first word line.

In an exemplary embodiment of the present invention, the method may further include forming an insulating interlayer covering the first sensing line and the first word line, forming a plug formed through the insulating interlayer and making contact with a portion of the impurity region adjacent to only to a sidewall of the first word line and forming a wiring electrically connected to the plug on the insulating interlayer. The portion may not be adjacent to a sidewall of the sensing line.

According to an exemplary embodiment of the present invention, in a method of erasing data in a non-volatile memory device, a selected word line is turned on. A selected sensing line is turned off. A positive voltage is applied to a bulk substrate part for tunneling electrons stored at a first conductive pattern of the selected sensing line. A source region is maintained in a floating state. The source region is formed between the selected word line and the selected sensing line. A positive voltage is applied to a drain region formed at a side of the selected word line.

According to exemplary embodiments of the present invention, a depletion layer in an upper portion of a substrate, which is disposed under a sensing line, of the non-volatile memory device is always in an on-state when a gate voltage of more than about 0 V is applied to a memory transistor. Thus, even when electrons are trapped in the tunnel oxide layer, an on-current may not be decreased below a critical value. As a result, the durability of the non-volatile memory device may be enhanced.

Since a punch-through phenomenon, in which depletion layers between source and drain regions make contact with each other, may not occur, a decrease of voltage in programming and erasing operations by the punch-through phenomenon may not occur. Thus, distribution failures of the threshold voltage of an on/off cell may be decreased.

Electron hole pair generation by a high electric field between an impurity region and a pocket well may be controlled by the depletion channel region. Thus, disturbance by the implantation of hot electrons may be reduced.

BRIEF DESCRIPTION OF THE DRAWINGS

Exemplary embodiments of the present invention will be understood in more detail from the following descriptions taken in conjunction with the accompanying drawings, in which.

DESCRIPTION OF EXEMPLARY EMBODIMENTS

The present invention is described more fully hereinafter with reference to the accompanying drawings, in which exemplary embodiments of the present invention are shown. The present invention may, however, be embodied in many different forms and should not be construed as limited to the exemplary embodiments set forth herein. Rather, these exemplary embodiments are provided so that this disclosure will be thorough and complete, and will fully convey the scope of the present invention to those of ordinary skill in the art.

Figure 1:
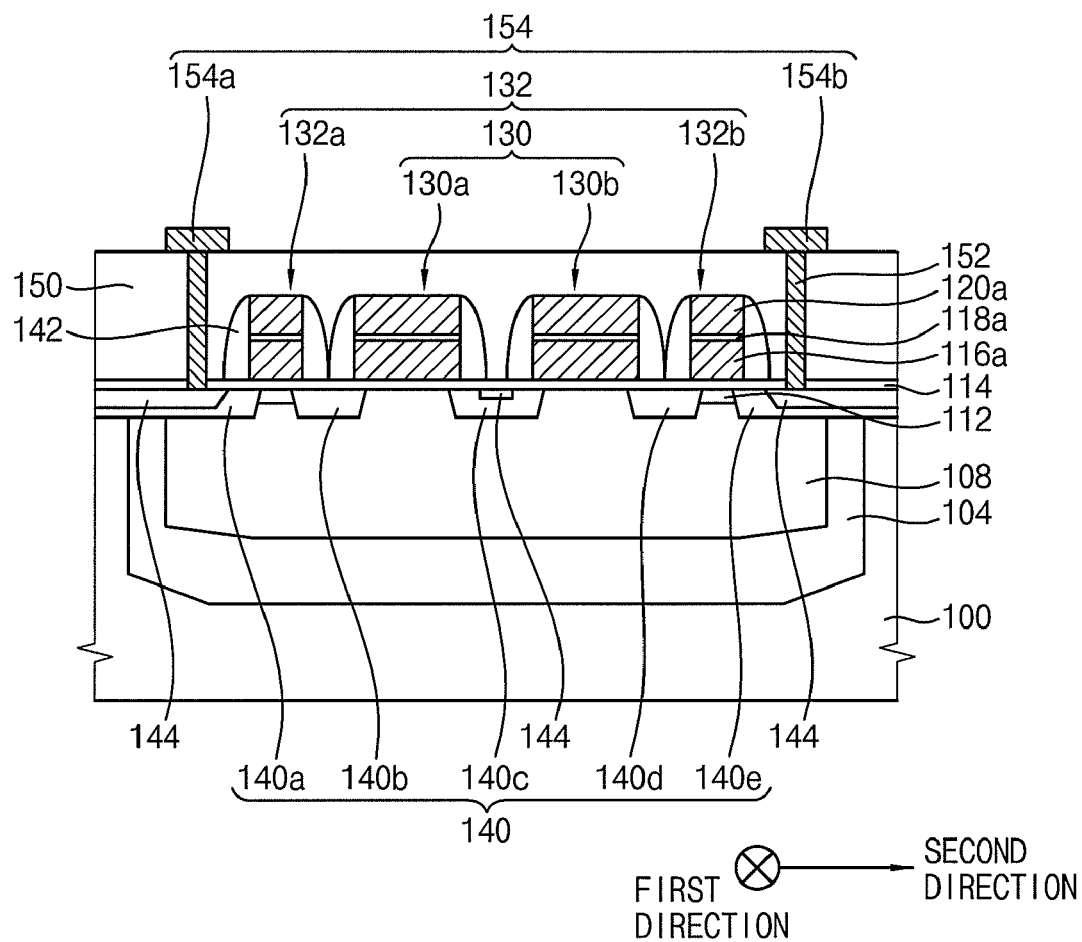
FIG. 1 is a cross-sectional view illustrating a non-volatile memory device in accordance with an exemplary embodiment of the present invention.

FIG. 1 is a cross-sectional view illustrating a non-volatile memory device in accordance with an exemplary embodiment of the present invention.

The non-volatile memory device may have a unit cell including a memory transistor and a select transistor. The memory transistor may store data and the select transistor may select a specific cell.

Referring to FIG. 1, a deep n-well 104 doped with n-type impurities is formed at a portion of a substrate 100 on which a cell is formed. A pocket p-well 108 doped with p-type impurities is formed in the n-well 104. The memory transistor and the select transistor included in the non-volatile memory device may be formed on the pocket p-well 108.

A plurality of structures including a tunnel oxide layer 114, a first conductive layer pattern 116a, a dielectric layer pattern 118a, and a second conductive layer pattern 120a sequentially stacked is formed on the substrate 100.

The tunnel oxide layer 114 may include silicon oxide. In an exemplary embodiment of the present invention, the tunnel oxide layer 114 may be formed by thermally oxidizing a top surface of the substrate 100. The first conductive layer pattern 116a may include polysilicon doped with n-type impurities and may store electrons therein. The dielectric layer pattern 118a may have an oxide-nitride-oxide (ONO) layer structure in which a silicon oxide layer, a silicon nitride layer, and a silicon oxide layer are sequentially stacked. Alternatively, the dielectric layer pattern 118a may include a metal oxide layer having a dielectric constant higher than that of a silicon oxide layer. The second conductive layer pattern 120a may include a metal or polysilicon doped with impurities.

Each of the structures may have a linear shape extending along a first direction and be disposed in parallel with one another. Each of the structures may serve as a sensing line 132 and a word line 130, respectively. The sensing line 132 and the word line 130 are disposed adjacent to each other.

The sensing line 132 may serve as a gate of a memory transistor. The word line 130 may serve as a gate of a select transistor. The select transistor may operate in substantially the same way as, or similar to, that of a common metal-oxide semiconductor (MOS) transistor. Thus, the first conductive layer pattern 116a may serve as a gate electrode of the select transistor. Additionally, the dielectric layer pattern 118a and the second conductive pattern 120a need not necessarily be used.

The sensing line 132 may have a first line width. The word line 130 may have a second line width wider than the first line width. When the word line 130 has a wider line width, a channel length becomes longer so that a cell may be accurately selected.

In exemplary embodiments, two word lines 130 and two sensing lines 132, each of which is formed adjacent to each of the word lines 130, respectively, form two unit cells. For example, a first sensing line 132a, a first word line 130a, a second word line 130b, and a second sensing line 132b may be sequentially formed in a second direction substantially perpendicular to the first direction on the substrate 100. The sensing lines 132 and the word lines 130 may be repeatedly formed in the second direction.

A depletion channel region 112, lightly doped with n-type impurities, is formed under the sensing lines 132 in an upper portion of the substrate 100. That is, the depletion channel region 112, lightly doped with n-type impurities, is formed at a region for a channel of the memory transistor. Thus, the memory transistor may be in an on-state in a standby state.

An impurity region 140 doped with n-type impurities is formed at portions of the substrate 100 exposed by the sensing lines 132 and the word lines 130. In an exemplary embodiment of the present invention, the impurity region 140 includes first through fifth impurity regions 140a, 140b, 140c, 140d, and 140e.

More specifically, the first impurity region 140a is formed adjacent to a first sidewall of the first sensing line 132a and electrically connected to a first bit line 154a. The second impurity region 140b is formed adjacent to a second sidewall of the first sensing line 132a and a first sidewall of the first word line 130a. The third impurity region 140c is formed adjacent to a second sidewall of the first word line 13a and a first sidewall of the second word line 130b. As illustrated in FIG. 1, the third impurity region 140c is formed in an upper portion of the substrate 100 adjacent to both of the two word lines 130a and 130b, so that the third impurity region 140c may serve as a common source of the two unit cells.

The fourth impurity region 140d is formed adjacent to a second sidewall of the second word line 130b and a first sidewall of the second sensing line 132b. The fifth impurity region 140e is formed adjacent to a second sidewall of the second sensing line 132b.

A highly doped region 144 that is doped with n-type impurities more highly than the impurity region 140 is formed in the first, third and fifth impurity regions 140a, 140c, and 140e. The highly doped region 144 formed in the first and fifth impurity regions 140a and 140e may reduce a contact resistance between the bit line 154 and the sensing lines 132. The highly doped region 144 formed in the third impurity region 140c may reduce the resistance of the common source.

Spacers 142 are formed at sidewalks of the sensing lines 132 and the word lines 130. The spacers 142 cover upper portions of the substrate 100 adjacent to the first sensing line 132a and the first word line 130a. Additionally, the spacers 142 cover upper portions of the substrate 100 adjacent to the second sensing line 132b and the second word line 130b. Furthermore, the spacers 142 partially cover upper portions of the substrate 100 adjacent to the first word line 130a and the second word line 130b, an upper portion of the substrate 100 adjacent to the first sidewall of the first sensing line 132a, and an upper portion of the substrate 100 adjacent to the first sidewall of the second sidewall of the second sensing line 132b.

An insulating interlayer 150 is formed on the substrate 100 to cover the word lines 130 and the sensing lines 132. Contact holes (not shown) exposing upper portions of the first and fifth impurity regions 140a and 140e are formed through the insulating interlayer 150.

Plugs 152 including a conductive material fill up the contact holes. The conductive material may include a metal or polysilicon doped with impurities. When each of the plugs 152 includes a metal material, a metal silicide layer (not shown) as an ohmic layer may be further formed between the plugs 152 and the substrate 100. Electric signals may be inputted or outputted to a drain region of the memory transistor through the plugs 152.

The bit lines 154 may be formed on the insulating interlayer 150. The bit lines 154 may be electrically connected to the plugs 152. The bit lines 154 may include a metal having low resistance. In this embodiment, the bit lines 154 are formed on the insulating interlayer 150 to be connected to the plugs 152, however, other wirings through which various signals are transferred may also be formed on the insulating interlayer 150 to be connected to the plugs 152.

FIGS. 2 to 10 are cross-sectional views illustrating a method of manufacturing a non-volatile memory device in accordance with an exemplary embodiment of the present invention.

Figure 2:
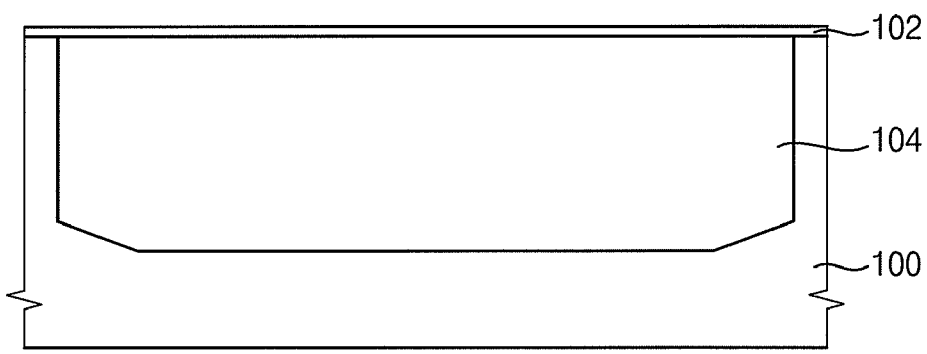
FIGS. 2 to 10 are cross-sectional views illustrating a method of manufacturing a non-volatile memory device in accordance with an exemplary embodiment of the present invention.

Referring to FIG. 2, a substrate 100 lightly doped with p-type impurities is prepared. A shallow trench isolation (STI) process may be performed on the substrate 100 to define an active region and an isolation region (not shown) in the substrate 100.

A top surface of the active region may be thermally oxidized to form a pad oxide layer 102. The pad oxide layer 102 may protect the substrate 100 when an ion implantation process is successively performed.

A deep n-well 104 is formed in the substrate 100. The deep n-well 104 may be formed by implanting n-type impurities into the substrate 100. An annealing process may be further performed to activate the impurities in the substrate 100. In an exemplary embodiment of the present, the deep n-well 104 has a graded junction structure.

Figure 3:
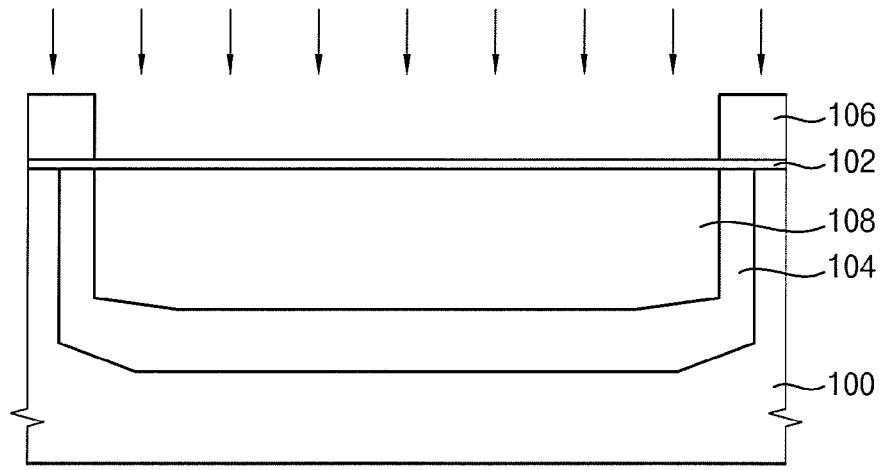

Referring to FIG. 3, a first photoresist pattern 106 is formed on the pad oxide layer 102 by a photolithography process so that a portion of the pad oxide layer 102, beneath which the deep n-well 104 is formed, is partially exposed. P-type impurities are implanted into the substrate 100 using the first photoresist pattern 106 as an ion implantation mask and, thus, a pocket p-well 108 doped with p-type impurities may be formed in the n-well 104. Channels of a memory transistor and a select transistor included in a cell may be formed in the pocket p-well 108.

The first photoresist pattern 106 may be removed by an ashing process and/or a stripping process.

Figure 4:
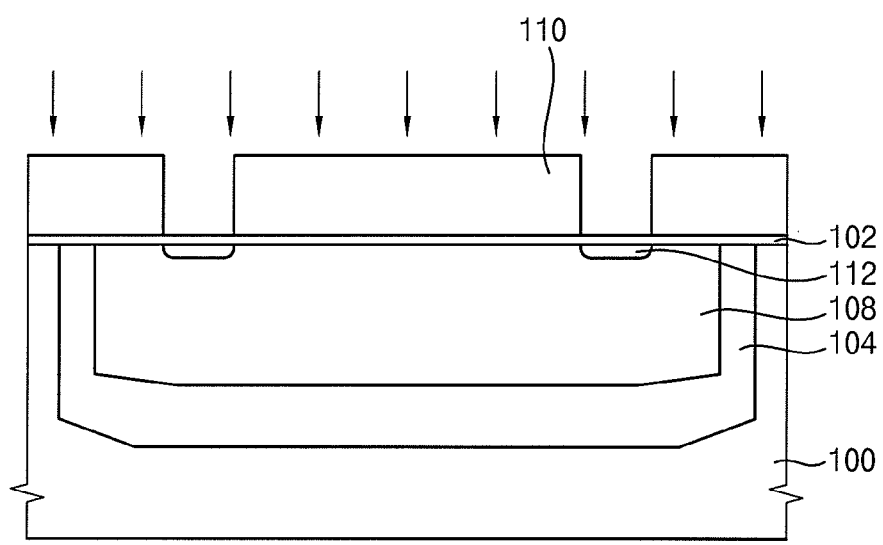

Referring to FIG. 4, a second photoresist pattern 110 exposing a region for sensing lines 132 (see FIG. 6) is formed on the pad oxide layer 102. The sensing lines 132 may serve as a gate of the memory transistor for storing data in the cell.

N-type impurities are implanted into the substrate 100 using the second photoresist pattern 110 as an ion implantation mask to form a depletion channel region 112 at upper portions of the substrate 100. The sensing lines 132 may be formed over the depletion channel region 112 in the successive process.

For example, the depletion channel region 112 may be formed by doping phosphorus with a dose of about $1.0E12/cm^2$ to about $1.0E13/cm^2$ and an energy of about 5 keV to about 30 keV. Alternatively, the depletion channel region 112 may be formed by doping arsenic with a dose of about $1.0E12/cm^2$ to about $1.0E13/cm^2$ and an energy of about 5 keV to about 30 keV. Alternatively, the depletion channel region 112 may be formed by doping phosphorus and arsenic with a dose of about $1.0E12/cm^2$ to about $1.0E13/cm^2$ and an energy of about 5 keV to about 30 keV.

The second photoresist pattern 110 may be removed by an ashing process and/or a stripping process.

Figure 5:
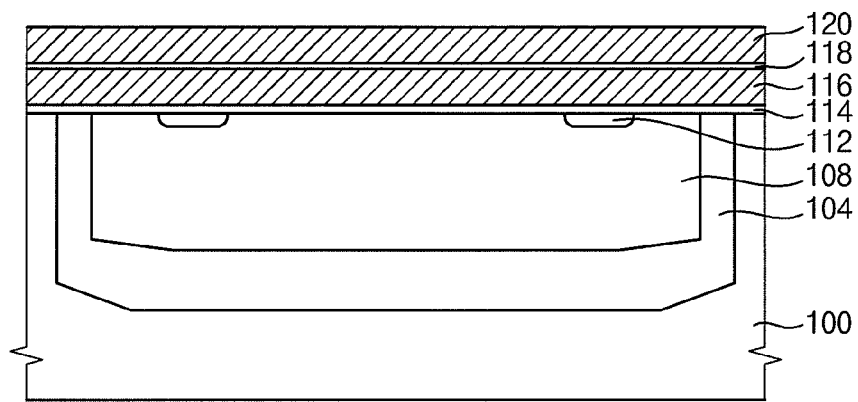

Referring to FIG. 5, the pad oxide layer 102 is removed. The pad oxide layer 102 may be removed by a wet-etching process in order to prevent damage to a top surface of the substrate 100.

A tunnel oxide layer 114 is formed by thermally oxidizing a top surface of the substrate 100. Electrons may move into or from a floating gate by Fowler-Nordheim (F-N) tunneling through the tunnel oxide layer 114.

A first conductive layer 116 is formed on the tunnel oxide layer 114. The first conductive layer 116 may include a material that is capable of containing electrons tunneled from the substrate 100. For example the first conductive layer 116 may include polysilicon doped with impurities.

A dielectric layer 118 is formed on the first conductive layer 116. The dielectric layer 118 may be formed by sequentially stacking silicon oxide, silicon nitride and silicon oxide on the first conductive layer 116. Alternatively, the dielectric layer 118 may be formed by depositing a metal oxide having a dielectric constant higher than that of silicon oxide.

A second conductive layer 120 is formed on the dielectric layer 118. The second conductive layer 120 may include polysilicon doped with impurities. When the dielectric layer 118 includes a metal oxide, the second conductive layer 120 is formed by sequentially stacking a metal and polysilicon doped with impurities on the dielectric layer 118.

Figure 6:
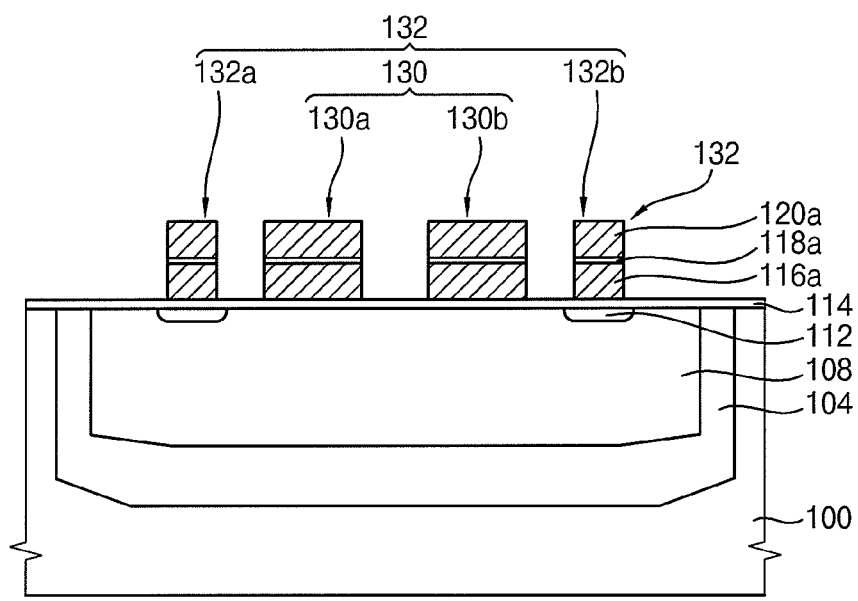
Figure 6:

Referring to FIG. 6, a third photoresist pattern (not shown) for patterning the word lines 130 and the sensing lines 132 is formed on the second conductive layer 120 by a photolithography process. The third photoresist pattern may have a linear shape extending along a first direction.

The word lines 130 and the sensing lines 132 may be formed by sequentially etching the second conductive layer 120, the dielectric layer 118, and the first conductive layer 116 using the third photoresist pattern as an etching mask. Each of the word lines 130 and the sensing lines 132 has a structure in which a first conductive layer pattern 116a, a dielectric layer pattern 118a, and a second conductive layer pattern 120a are sequentially stacked on the tunnel oxide layer 114.

The sensing lines 132 are formed over the depletion channel layer 112. The word lines 130 and the sensing lines 132 are formed to be adjacent to each other. The word lines 130 and the sensing lines 132 are patterned so that a width of the sensing lines 132 may be smaller than that of the word lines 130.

In an exemplary embodiment of the present invention, two word lines forming the word lines 130 and two sensing lines forming the sensing lines 132 are formed on the tunnel oxide layer 114. The two word lines 130 and the two sensing lines 132 may form two unit cells. Each of the sensing lines 132 is formed near each of the word lines 130, respectively. As illustrated in FIG. 6, a first sensing line 132a, a first word line 130a, a second word line 130b and a second sensing line 132b may be sequentially formed in a second direction substantially perpendicular to the first direction on the tunnel oxide layer 114. The sensing lines 132 and the word lines 130 may be repeatedly formed in the second direction.

In an exemplary embodiment of the present invention, a distance between the sensing lines 132 and the word lines 130 is smaller than that between the word lines 130.

Figure 7:
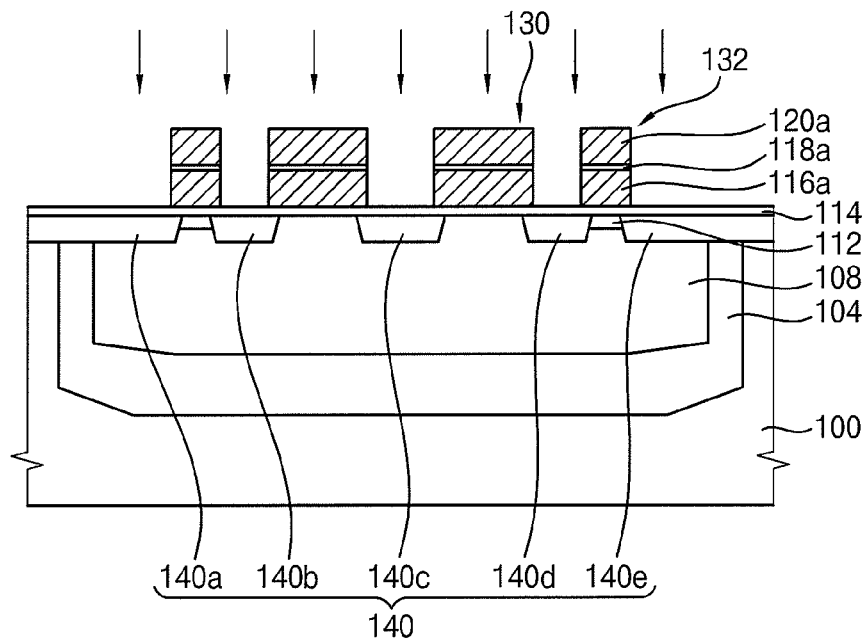

Referring to FIG. 7, n-type impurities are highly doped into upper portions of the substrate 100 on which portions of the tunnel oxide layer 114, exposed by the word lines 130 and the sensing lines 132, are formed to form an impurity region 140. In an exemplary embodiment of the present invention, the impurity region 140 includes first through fifth impurity regions 140a, 140b, 140c, 140d and 140e.

More specifically, the first impurity region 140a is formed adjacent to a first sidewall of the first sensing line 132a (see FIG. 1) and is electrically connected to a first bit line 154a (see FIG. 1). The second impurity region 140b is formed adjacent to a second sidewall of the first sensing line 132a and a first sidewall of the first word line 130a. The third impurity region 140c is formed adjacent to a second sidewall of the first word line 130a and a first sidewall of the second word line 130b. The third impurity region 140c is formed in an upper portion of the substrate 100 adjacent to both of the two word lines 130a and 130b, so that the third impurity region 140c may serve as a common source of two unit cells.

The fourth impurity region 140d is formed adjacent to a second sidewall of the second word line 130b and a first sidewall of the second sensing line 132b. The fifth impurity region 140e is formed adjacent to a second sidewall of the second sensing line 132b.

The first and second impurity regions 140a and 140b are connected to the depletion channel region 112. Additionally, the fourth and fifth impurity regions 140d and 140e are connected to the depletion channel region 112. That is, a source region and a drain region are connected to each other through the depletion channel region 112 in the memory transistor. Thus, when a gate of the memory transistor has a voltage above about 0 V, the memory transistor is in an on-state.

Figure 8:
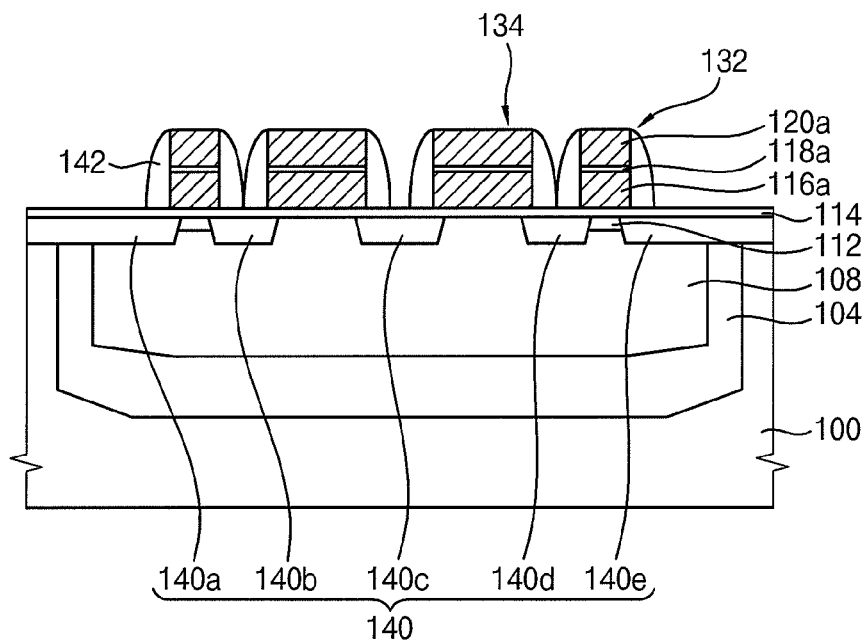

Referring to FIG. 8, a thermal oxidation process in which surfaces of the first and second conductive layer patterns 116a and 120a are thermally oxidized is performed so that etching damage generated when the word lines 130 and the sensing lines 132 are patterned may be cured. When the first and second conductive layer patterns 116a and 120a include polysilicon, a silicon oxide layer (not shown) may be formed on the surfaces of the first and second conductive layer patterns 116a and 120a by the thermal oxidation process.

A medium temperature oxide layer and a silicon nitride layer are sequentially formed on the word lines 130, the sensing lines 132 and the substrate 100 without completely covering a portion of the tunnel oxide layer 114 adjacent to both the word lines 130 and the sensing lines 132. The medium temperature oxide layer and the silicon nitride layer may be anisotropically etched to form spacers 142 at sidewalls of the word lines 130 and the sensing lines 132. In this exemplary embodiment, a plurality of the spacers 142 is formed, one at each sidewall.

The spacers 142 may cover portions of the tunnel oxide layer 114 adjacent to both the first sensing line 132a and the first word line 130a and portions of the tunnel oxide layer 114 adjacent to both the second sensing line 132b and the second word line 130b. Additionally, the spacers 142 may be formed to only partially cover a portion of the tunnel oxide layer 114 adjacent to both the first word line 130a and the second word line 130b.

Figure 9:
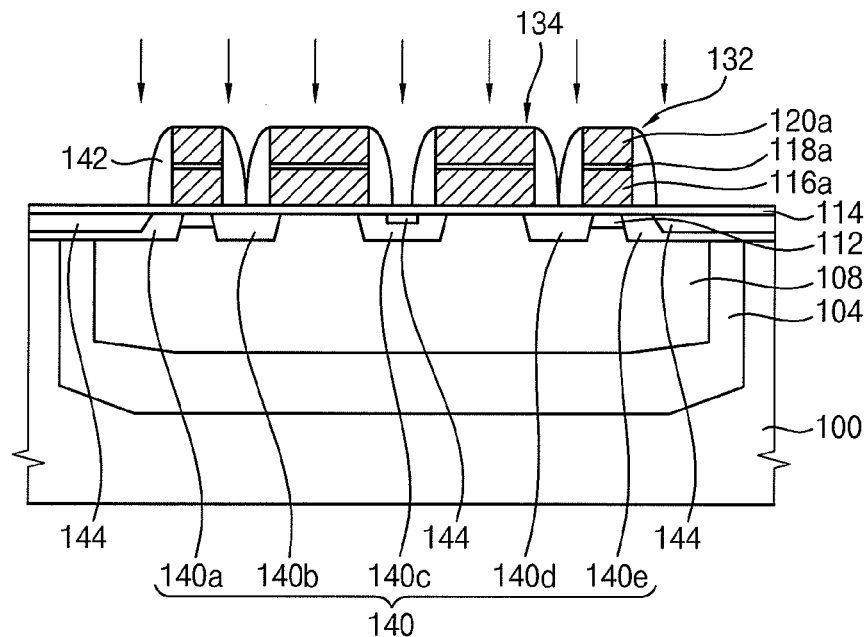

Referring to FIG. 9, n-type impurities are implanted into portions of the substrate 100 exposed by the spacers 142 to form a highly doped region 144. Particularly, the highly doped region 144 may be formed in the first, third, and fifth impurity regions 140a, 140c and 140e.

Figure 10:
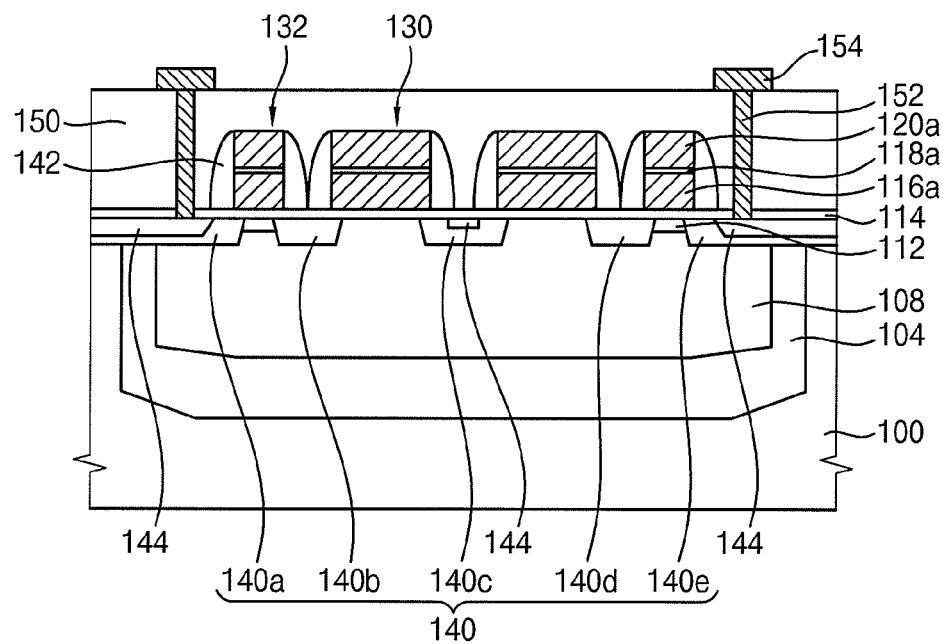

Referring to FIG. 10, after a metal layer (not shown) is formed on the exposed tunnel oxide layer 114, the word lines 130, the sensing lines 132 and the spacers 142, a heat treatment is performed on the metal layer. Thus, silicon included in the tunnel oxide layer 114, the word lines 130 and the sensing lines 132 are reacted with the metal layer, and a metal silicide pattern (not shown) may be formed on the word lines 130, the sensing lines 132, and the tunnel oxide layer 114. A portion of the metal layer that is not reacted with silicon is removed.

An insulating interlayer 150 is formed on the tunnel oxide layer 114 to cover the word lines 130 and the sensing lines 132. A chemical mechanical polishing (CMP) process may be performed to planarize a top surface of the insulating interlayer 150.

The insulating interlayer 150 may be partially removed by an etching process to form a contact hole (not shown) therein. In an exemplary embodiment of the present invention, a plurality of the contact holes exposing the first and fifth impurity regions 140a and 140e is formed. A conductive material may be filled in the contact holes to form plugs 152.

A conductive layer is formed on the insulating interlayer 150 and the plugs 152 and patterned to form bit lines 154 that are electrically connected to the plugs 152.

When a voltage above about 0 V is applied to a gate of a memory transistor in accordance with embodiments of the present invention, the memory transistor is in an on-state and, thus, has operation characteristics different from those of a common non-volatile memory device. More specifically, the non-volatile memory device in accordance with exemplary embodiments should be differently operated so that data in the selected transistor may not be changed by an unselected transistor adjacent to the selected transistor.

Figure 11:
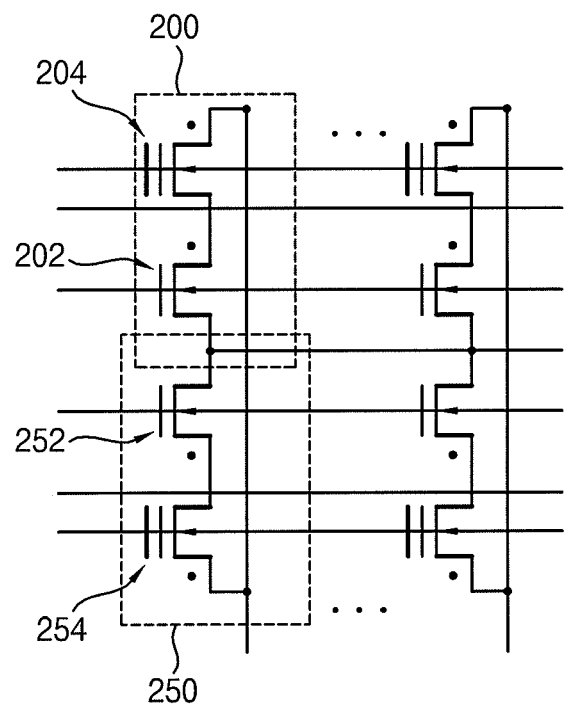
FIG. 11 is a circuit diagram of a non-volatile memory in accordance with an exemplary embodiment of the present invention.

FIG. 11 is a circuit diagram of a non-volatile memory in accordance with an exemplary embodiment of the present invention.

Each of reference numerals 200 and 250 in FIG. 11 represents a unit cell. Hereinafter, voltages applied to a selected cell and an unselected cell for performing programming and erasing operations of the selected cell of the non-volatile memory device are illustrated.

A method of programming the selected cell of the non-volatile memory device in accordance with an exemplary embodiment is illustrated as follows.

Table 1 shows bias voltages of the selected cell and the unselected cell when a programming operation is performed in the non-volatile memory device in accordance with an exemplary embodiment of the present invention.

TABLE 1

| | | Word line | Sensing line | Source | Bit line | PP_WELL |
|---|---|---|---|---|---|---|
| Programming | Selected cell | Vnn | Vpp | Floating | Vnn | Vnn |
| | Unselected cell | Vnn | Vpi | Floating | Vpi | Vnn |

A negative voltage Vnn is applied to a word line of a first select transistor 202 included in a selected cell 200. More specifically, the negative voltage Vnn is applied to a first conductive layer pattern included in the first select transistor 202. In this case, the first select transistor 202 is turned off.

A positive voltage Vpp is applied to a sensing line of a first memory transistor 204 included in the selected cell 200. More specifically, the positive voltage Vpp is applied to a second conductive pattern included in the first memory transistor 204. When the positive voltage Vpp is applied to the sensing line of the first memory transistor 204, electrons are stored in the first conductive pattern of the first memory transistor 204. Thus, the threshold voltage of the first memory transistor 204 may increase.

Additionally, a source region of the first select transistor 202 is placed in a floating state. The negative voltage Vnn is applied to a first bit line, which is electrically connected to a drain region of the first memory transistor 204, and a pocket p-well serving as a body for parts of the first select transistor 202 and the first memory transistor 204.

A predetermined voltage is also applied to an unselected cell 250, which is adjacent to the selected cell 200 and shares an active region with the selected cell 200, so that the unselected cell 250 may not be influenced by the selected cell 200.

More specifically, the negative voltage Vnn is applied to a word line of a second to select transistor 252 included in the unselected cell 250. When the negative voltage Vnn is applied to the word line of the second select transistor 252 included in the unselected cell 250, the second select transistor 252 is turned off.

A program control voltage Vpi is applied to a sensing line of a second memory transistor 254 included in the unselected cell 250. In this case, the second memory transistor is not programmed.

The first and second select transistors 202 and 252 share a source region in common, so that the source region of the second select transistor 252 is also placed in a floating state.

The program control voltage Vpi is applied to a second bit line electrically connected to a drain region of the second memory transistor 254. Additionally, the negative voltage Vnn is applied to a pocket p-well serving as a body for parts of the second select transistor 252 and the second memory transistor 254.

As described above, a voltage applied to the cell in programming in accordance with an exemplary embodiment of the present invention is substantially the same as that of a conventional non-volatile memory device.

When a selected cell is programmed in the non-volatile memory device in accordance with an exemplary embodiment of the present invention, the threshold voltage of a memory transistor included in the selected cell increases. A gate of the memory transistor included in the selected cell, however, is in an on-state in a standby state in which a voltage applied to the gate is above about 0 V. Thus, the threshold voltage is much lower than that of the conventional non-volatile memory device when the selected cell is programmed. More specifically, the programmed memory transistor may have a very small threshold voltage or a negative voltage.

A method of erasing the selected cell of the non-volatile memory device shown in FIG. 11 in accordance with an exemplary embodiment of the present invention will be illustrated as follows.

Table 2 shows bias voltages in the selected cell and the unselected cell when an erasing operation is performed in the non-volatile memory device in accordance with an exemplary embodiment of the present invention.

TABLE 2

|  |  | Word line | Sensing line | Source | Bit line | PP_WELL |
|---|---|---|---|---|---|---|
| Programming | Selected cell | Vpp | Vnn | floating | Vpp | Vpp |
|  | Unselected cell | Vpp | Vpi | floating | Vpi | Vnn |

A negative voltage Vnn is applied to a word line of a first select transistor 202 included in a selected cell 200. The first select transistor 202 is turned on.

A negative voltage is applied to a sensing line of a first memory transistor 204, which is included in the selected cell 200. Electrons stored in a first conductive pattern of the first memory transistor 204 move into a bulk substrate by a tunneling effect. A threshold voltage of the first memory transistor 204 becomes lower by the escape of electrons in the first conductive pattern. The first memory transistor 204 at has a relatively lower negative voltage in an erasing state than that of a conventional non-volatile memory device in an erasing state.

A source of the first select transistor 202 is placed in a floating state. A positive voltage Vpp is applied to a first bit line electrically connected to a drain of the first memory transistor 204 and a pocket p-well serving as a body for parts of the first select transistor 202 and the first memory transistor 204. An electron hole pair generated by an electric field in the first bit line and the pocket p-well is controlled by applying substantially the same positive voltage to the first bit line and the pocket p-well.

Additionally, the first and second select transistors 202 and 252 share one source region in common, so that the source region of the second select transistor 252 is also placed in a floating state.

The program control voltage Vpi is applied to a second bit line electrically connected to a drain region of the second memory transistor 254. Additionally, the second memory transistor 252 is always in an on-state, in which a gate voltage is above about 0 V, so that signals applied to the second bit line may be transmitted to the first memory transistor 204 through the second memory transistor 254 and the first select transistor 202. The program control voltage Vpi is applied to the second bit line, so that signals applied to the second bit line may not affect the first memory transistor 204.

Substantially the same positive voltage is applied to a pocket p-well serving as a body for parts of the second select transistor 252 and the second memory transistor 254.

Figure 12:
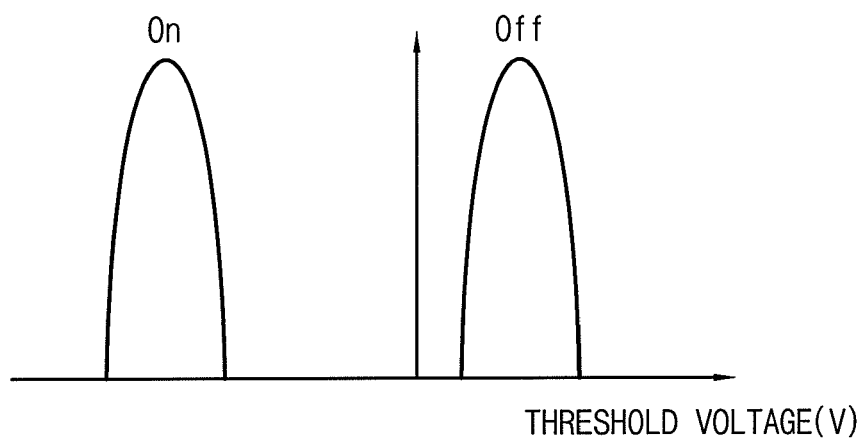
FIG. 12 is a graph illustrating a threshold voltage distribution when data is programmed and erased in a unit cell of a non-volatile memory device in accordance with an exemplary embodiment of the present invention.

FIG. 12 is a graph illustrating a threshold voltage distribution when data is programmed and erased in a unit cell of a non-volatile memory device in accordance with an exemplary embodiment of the present invention.

Referring to FIG. 12, the nonvolatile memory device in accordance with an exemplary embodiment of the present invention includes a memory transistor having a depletion type channel, so that the threshold voltage of the memory transistor in an off-state is lower than that of a conventional non-volatile memory device. Additionally, the threshold voltage of the memory transistor in an on-state is much lower than that of the conventional non-volatile memory device, and may be less than about 0 V.

When a reading operation, in which data stored in a memory transistor is read, is performed, a reading voltage is lower than a threshold voltage in an off-state and higher than a threshold voltage in an on-state. The reading voltage may be a negative voltage according to conditions of a reading sense amplifier.

As described above, a non-volatile memory device in accordance with exemplary embodiments includes a depletion channel region in a memory transistor and, thus, may have a structure substantially the same as a structure in which source/drain regions of the memory transistor in a cell are connected to each other by the depletion channel region serving as a resistor. Thus, even though electrons are trapped in a tunnel oxide layer by repeatedly programming and erasing data in the cell, an on-current may not be decreased below a critical value. As a result, operation failures generated from the decrease of the on-current may be prevented.

Additionally a punch-through phenomenon in which depletion layers of the source/drain regions make contact with each other may not occur, so that voltages may not be decreased in programming/erasing operations by the punch-through phenomenon. Thus, distribution failures of threshold voltages of on and off cells may be decreased.

Furthermore, electron hole pair generation due to a high electric field between an impurity region and a pocket well may be prevented by the depletion channel region. Thus, disturbances generated by the implantation of hot electrons may be reduced.

According to exemplary embodiments of the present invention, a non-volatile memory device may have a good threshold voltage distribution of on and off cells and high durability. Also, the non-volatile memory device may be easily manufactured by following simple processes.

The foregoing is illustrative of exemplary embodiments of the present invention and is not to be construed as limiting thereof. Although a few exemplary embodiments of the present invention have been described, those of ordinary skill in the art will readily appreciate that many modifications are possible in the exemplary embodiments without materially departing from the novel teachings and advantages of the present invention. Accordingly, all such modifications are intended to be included within the scope of this invention as defined in the claims. Therefore, it is to be understood that the foregoing is illustrative of the present invention and is not to be construed as limited to the exemplary embodiments disclosed, and that modifications to the disclosed exemplary embodiments, as well as other exemplary embodiments, are intended to be included within the scope of the appended claims. The present invention is defined by the following claims, with equivalents of the claims to be included therein.

What is claimed is:

1. A non-volatile memory device comprising:
a first sensing line and a first word line formed adjacent to each other in parallel on a substrate, the first sensing line and the first word line having a tunnel oxide layer, a first conductive pattern, a dielectric layer pattern and a second conductive pattern sequentially stacked on the substrate;
a depletion channel region formed at an upper portion of the substrate under the first sensing line; and
impurity regions at upper portions of the substrate exposed by the first sensing line and the first word line.

2. The non-volatile memory device of claim 1, further comprising:
a well doped with first conductive type impurities at a portion of the substrate for a cell of the non-volatile memory device; and
a pocket well doped with second conductive type impurities in the well, the second conductive type being different from the first conductive type.

3. The non-volatile memory device of claim 1, further comprising spacers formed at both sides of the first sensing line and the first word line.

4. The non-volatile memory device of claim 3, wherein the spacers cover portions of the substrate adjacent to both the first sensing line and the first word line.

5. The non-volatile memory device of claim 1, further comprising a highly doped region in a portion of the impurity region not adjacent to both the first sensing line and the first word line, the highly doped region being configured to be doped more highly than other portions of the impurity region.

6. The non-volatile memory device of claim 1, wherein the first sensing line and the first word line are included in a first unit cell, and
further comprising a second unit cell having a second sensing line and a second word line.

7. The non-volatile memory device of claim 6, wherein the first sensing line and the first word line included in the first unit cell and the second sensing line and the second word line included in the second unit cell are disposed symmetrically with respect to a boundary of the unit cells.

8. The non-volatile memory device of claim 6, wherein a distance between the first word line and the second word line is wider than a distance between the first sensing line and the first word line.

9. The non-volatile memory device of claim 1, further comprising:
an insulating interlayer covering the first sensing line and the first word line;
a plug formed through the insulating interlayer and making contact with a portion of the impurity region adjacent to only to a sidewall of the first word line, the portion not being adjacent to a sidewall of the first sensing line; and
a wiring electrically connected to the plug on the insulating interlayer.

10. A method of manufacturing a non-volatile memory device comprising:
forming a depletion channel region by implanting first conductive type impurities into an upper portion of a substrate;
forming a layer structure in which a tunnel oxide layer a first conductive layer, a dielectric layer, and a second conductive layer are sequentially stacked on the substrate;
patterning the layer structure to form a first sensing line on the depletion channel region and a first word line on a portion of the substrate adjacent to the depletion channel region; and
forming impurity regions by implanting the first conductive type impurities into portions of the substrate exposed by the first sensing line and the first word line.

11. The method of claim 10, prior to forming the depletion channel region, further comprising:
forming a deep wet by implanting the first conductive type impurities into a portion of the substrate for a cell of a memory device; and
forming a pocket well in the well by implanting second conductive type impurities into the deep well, the second conductive type being different from the first conductive type.

12. The method of claim 10, further comprising forming spacers at both sides of the first sensing line and the first word line.

13. The method of claim 12, wherein the spacers are formed to have a thickness to sufficiently cover portions of the substrate exposed by the first sensing line and the first word line.

14. A method of claim 10, further comprising forming a highly doped region in the impurity region by partially implanting the first conductive type impurities into a portion of the impurity region, the portion being configured not to be adjacent to both the first sensing line and the first word line.

15. The method of claim 10, wherein the first sensing line has a different width from a width of the first word line, and wherein the first sensing line and the first word line are included in a first unit cell,
further comprising a second unit cell having a second sensing line and a second word line, and
wherein the first word line and the first sensing line included in the first unit cell and the second sensing line and the second word line included in the second unit cell next to the first unit cell are formed to be symmetrically disposed with respect to a boundary between the first and the second unit cells.

16. The method of claim 15, wherein a distance between the first word line and the second word line is wider than a distance between the first sensing line and the first word line.

17. The method of claim 10, further comprising:
forming an insulating interlayer covering the first sensing line and the first word line;
forming a plug formed through the insulating interlayer and making contact with a portion of the impurity region adjacent to only to a sidewall of the first word line, the portion not being adjacent to a sidewall of the sensing line; and
forming a wiring electrically connected to the plug on the insulating interlayer.

18. A method of erasing data in a non-volatile memory device, the non-volatile memory device comprising sensing lines and word lines formed adjacent to each other in parallel on a substrate, each of the sensing lines and each of the word lines having a tunnel oxide layer, a first conductive pattern, a dielectric layer pattern, and a second conductive pattern sequentially stacked on the substrate, a depletion channel region at an upper portion of the substrate and impurity regions at upper portions of the substrate exposed by each of the sensing lines and each of the word lines, comprising:
   turning on a selected word line among the word lines;
   turning off a selected sensing line among the sensing lines;
   applying a positive voltage into a bulk substrate part for tunneling electrons stored at a first conductive pattern of the selected sensing line;
   maintaining a source region as a floating state, the source region being formed between the selected word line and the selected sensing line; and
   applying a positive voltage to a drain region formed at a side of the selected word line.

* * * * *